(12) United States Patent
Temmler et al.

(10) Patent No.: US 7,265,025 B2
(45) Date of Patent: Sep. 4, 2007

(54) METHOD FOR FILLING TRENCH AND RELIEF GEOMETRIES IN SEMICONDUCTOR STRUCTURES

(75) Inventors: Dietmar Temmler, Dresden (DE); Barbara Lorenz, Dresden (DE); Daniel Koehler, Dresden (DE); Matthias Foerster, Dresden (DE)

(73) Assignee: Infineon Technologies AG, Munich (DE)

( * ) Notice: Subject to any disclaimer, the term of this patent is extended or adjusted under 35 U.S.C. 154(b) by 342 days.

(21) Appl. No.: 11/010,186

(22) Filed: Dec. 10, 2004

(65) Prior Publication Data

US 2005/0148171 A1     Jul. 7, 2005

Related U.S. Application Data

(63) Continuation of application No. PCT/DE03/01923, filed on Jun. 10, 2003.

(30) Foreign Application Priority Data

Jun. 11, 2002   (DE)  ................................. 102 25 941

(51) Int. Cl.
  *H01L 21/76*   (2006.01)
(52) U.S. Cl. ...................... 438/435; 438/437; 438/713; 438/738
(58) Field of Classification Search ................ 438/435, 438/437, 713, 738
See application file for complete search history.

(56) References Cited

U.S. PATENT DOCUMENTS

| 4,666,737 | A |   | 5/1987 | Gimpelson et al. |
| 4,833,094 | A | * | 5/1989 | Kenney ....................... 438/243 |
| 5,346,585 | A |   | 9/1994 | Doan et al. |
| 5,451,809 | A |   | 9/1995 | Shiozawa et al. |
| 5,904,561 | A |   | 5/1999 | Tseng |
| 5,933,746 | A |   | 8/1999 | Begley et al. |
| 6,030,881 | A |   | 2/2000 | Papasouliotis et al. |
| 6,066,566 | A | * | 5/2000 | Naeem et al. .............. 438/700 |
| 6,077,786 | A |   | 6/2000 | Chakravarti et al. |
| 6,124,203 | A |   | 9/2000 | Joo et al. |
| 6,191,026 | B1 |   | 2/2001 | Rana et al. |
| 6,207,494 | B1 | * | 3/2001 | Graimann et al. .......... 438/248 |
| 6,284,665 | B1 | * | 9/2001 | Lill et al. ................... 438/710 |
| 6,287,964 | B1 |   | 9/2001 | Cho |
| 6,627,514 | B1 | * | 9/2003 | Park et al. .................. 438/435 |

FOREIGN PATENT DOCUMENTS

JP         07-161703         6/1995

* cited by examiner

*Primary Examiner*—Trung Dang
(74) *Attorney, Agent, or Firm*—Slater & Matsil, L.L.P.

(57) ABSTRACT

A method teaches how to fill trench structures formed in a semiconductor substrate. The trench structures are coated in a first deposition process with a first primary filling layer with a high conformity and minimal roughness. A V etching reaching down to a predetermined depth of the trench structure is subsequently performed in order to produce a V-profile.

21 Claims, 2 Drawing Sheets

FIG 2A  FIG 2B  FIG 2C  FIG 2D
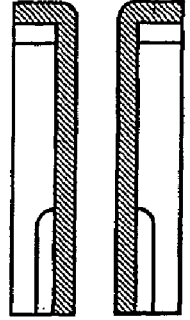
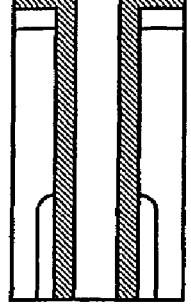
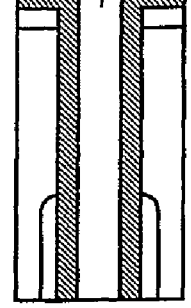
FIG 2E  FIG 2F  FIG 2G  FIG 2H  FIG 2I
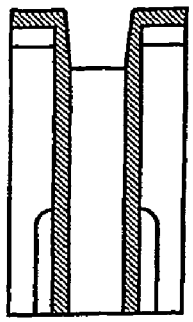
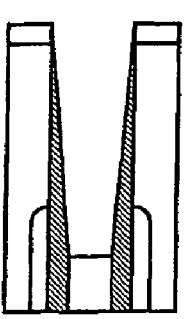
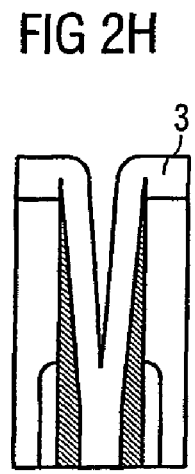
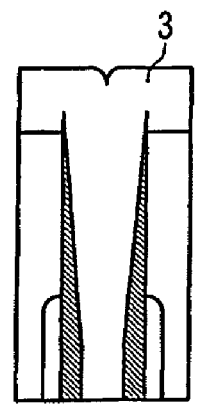

METHOD FOR FILLING TRENCH AND RELIEF GEOMETRIES IN SEMICONDUCTOR STRUCTURES

This is a continuation of PCT/DE03/01923, filed on Jun. 10, 2003, which claims priority to German Patent Application No. 102 25 941.0, filed on Jun. 11, 2002, which applications are hereby incorporated herein by reference.

TECHNICAL FIELD

The invention relates to a method for filling trench and relief geometries in semiconductor structures.

BACKGROUND

The continual scaling of semiconductor components is generally also accompanied by an increase in the aspect ratio (depth/width) of the trench and relief structures therein, which are formed on substrates. At a structural level of ≦100 nm, aperture angles of around 0.1° are achieved in some instances. The small aperture angles make it increasingly difficult to fill these extremely steep profiles. Although highly conformal deposition methods (almost 100%) have been specially developed for a wide variety of conducting or insulating filling layers, extremely small production dictated profile fluctuations result in the occurrence of non ideally closed closing joints (voids) along the centre axis of such field trench and relief structures.

The particular disadvantages of such voids are to be seen in the fact that they reduce the geometrical cross section of conductive fillings in an uncontrolled manner and thereby increase the electrical resistance thereof or adversely affect other parameters. Thus, storage capacitors for DRAM cells are fabricated for example by deep trench etching, dielectric coating of the trench walls and subsequent filling of the trench with a conductive material. Voids in this conductive filling increase the resistance thereof in an uncontrolled manner.

For the frequently occurring case in which fillings of trenches or reliefs have to be superficially planarized or (partially) etched back (recess etching) for functional reasons, voids in the filling lead, depending on their size, to local fluctuations in the planarization or recess etching rate. That leads to uncontrollable fluctuations for the depth position and the profile of the planarized or recess areas. Generally, the void region is significantly enlarged in terms of width and depth. Under certain circumstances, that affects the further processing and the parameters of these arrangements by a non-reproducible (v shaped) relief of the planarization or recess surface of the primary filling being reproduced in a subsequent layer deposition. If the subsequent layer is then to be removed again by means of anisotropic RIE etching (reactive ion etching) on the recess surface, that is not completely successful. The cause of this is that the layer material of the subsequent layer has been deposited deep into the void region. That then leads to electrical short circuits (given insulated filling layer and conductive subsequent layer) or to interruptions in the current path (given conductive filling layer and insulating subsequent layer) and may additionally act as a particle and contamination source during the further processing.

The production of these voids has been avoided hitherto by means of a sufficiently v-shaped profile of the trench or relief structures. During a highly conformal deposition of the filling layer, the latter thereby accretes from bottom to top in void free fashion at its seam location. The further scaling of the structures means that it is no longer possible to furnish the area requirement for the wall inclination of the trench or relief structures. The reproducible setting of very steep sidewalls of the trench or relief structures is extremely problematic, which is why this method is increasingly failing to work.

Another practically proven possibility for subsequently closing the void independently of the profile of the trench or relief structures consists in the use of an additional thin conformal deposition (divot fill) comprising the same material type (conductive or insulating) as the primary filling layer and subsequent (wet chemical) removal of the divot fill layer deposited on the substrate surface and on the sidewalls of the relief structure.

In this case, it is disadvantageous that the recess etchings effected before the divot fill are not improved. Primarily, however, the process window for the recess etching of the divot fill is very small. Either residues subsequently remain on the substrate surface and the walls of the trench or relief structures, or the void is completely or at least partially opened again.

U.S. Pat. No. 6,359,300 discloses a deep trench capacitor in a wafer with void free filling. The trench capacitor comprises a substrate, a trench formed in the substrate and a conductive filling material which completely fills the trench and comprises doped germanium or a silicon germanium alloy.

In order to achieve a void free filling, the conductive doped germanium or the silicon germanium alloy is deposited in the trench and a filling layer is produced on the substrate. Afterwards, the wafer is heated until the filling layer melts and flows completely into the trench.

Such a method is not practicable for polysilicon, $SiO_2$ or metal filling layers owing to the high temperatures required.

U.S. Pat. No. 4,666,737 describes the metallization of deep vias in an insulating layer. In a first deposition process, the trench and relief structures are coated with a first primary conformal layer of tungsten. Then, a plasma-chemical v-etching reaching down to a predetermined depth of the trench structure is performed in order to produce a v-profile. A second primary conformal filling layer of aluminum is then deposited until the trench and relief structure is completely continuous. However, this method is not suitable for filling particularly deep trench and relief structures.

A similar but more complex method is disclosed by PATENT ABSTRACTS OF JAPAN vol. 1995, No. 09, 31 Oct. 1995 (1995-10-31) and Japanese publication 07-161703 A.

U.S. Pat. No. 5,451,809 has disclosed a method for producing trench capacitors in which the trench is filled with a conductive silicon by multiple coating alternating with etching-back.

SUMMARY OF THE INVENTION

The invention is based on the object, then, of providing a method for filling trench and relief structures in semiconductor structures by means of which the production of voids can be reliably avoided and which can be realized in a simple and cost effective manner.

The object on which the invention is based is achieved by means of a method for filling trench and relief structures formed in a semiconductor substrate. This method is characterized in that the trench and relief structures are coated in a first deposition process with a first primary filling layer with high conformity and minimal roughness. A 'V' etching reaching down to a predetermined depth of the trench structure is subsequently performed in order to produce a 'V' profile. A second primary filling layer with high conformity and minimal roughness is deposited until the trench and relief structure is completely closed.

A particular refinement of the invention emerges from a method that is characterized in that, after the deposition of the first filling layer, there is deposited on the latter a filling auxiliary layer, which is subsequently removed again in a planarizing manner on the substrate surface. A predominantly isotropically acting wet chemical etching step is carried out until the complete removal of the first filling layer on the surface of the semiconductor substrate. A wet chemical etching is subsequently carried out, by which the material of the filling auxiliary layer that has remained in the trench and relief structure is completely removed again with high selectivity with respect to the first filling layer. The second filling layer is then deposited.

Further features of the invention emerge from the description provided herein.

The advantages of the method according to the invention are to be seen in the fact that a completely void free filling of scaled trench and relief structures is achieved from the outset, decoupled from the profile of the trench and relief structures. In particular, a void free filling can be achieved even with an arbitrarily steep wall profile—fluctuating due to process tolerances—of the trench and relief structures or even with a negative (overhanging) profile of the trench and relief structure.

Moreover, the subsequent disadvantages described in the introduction are avoided and the decoupling of the filling process from the initial profile of the trench and relief structure results in an increase in the process stability during the further processing.

Subsequent void "repair steps" (divot fill) and the associated problems are avoided as well.

Advantage is also attached to the integrability of an advantageous polysilicon metal filling for the application of memory trench filling and the setting of advantageous contact window profiles for the application of isolation gap filling.

BRIEF DESCRIPTION OF THE DRAWINGS

The invention will be explained in more detail below using exemplary embodiments. In the associated drawings:

FIGS. 2a-2i show a two-stage trench filling with filling auxiliary layer deposited after the first filling layer deposition and subsequent bias etching step using the example of trench memory cells.

Figure 1A:
FIGS. 1a-1e show a two-stage trench filling with a V-etching step after the first filling layer deposition using the example of trench memory cells.
Figure 1B:
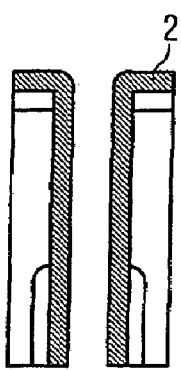
Figure 1C:
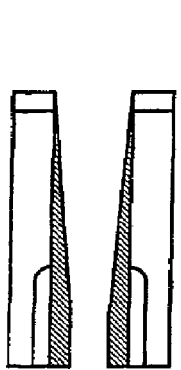
Figure 1D:
Figure 1E:
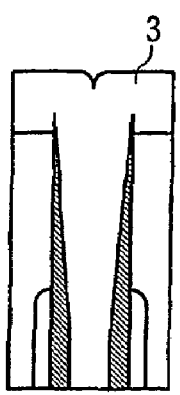

The following reference numerals can be used in conjunction with the drawings:
1. Semiconductor substrate with trench or relief structure
2. First filling layer
3. Second filling layer
4. Filling auxiliary layer

DETAILED DESCRIPTION OF ILLUSTRATIVE EMBODIMENTS

Various aspects of the present invention will now be described with respect to a number of exemplary embodiments.

Exemplary Embodiment 1

FIG. 1a diagrammatically illustrates a semiconductor substrate 1 with a trench and relief structure that has already been prepared and is to be filled by the method according to the invention, illustrated in FIGS. 1b-1e. In accordance with FIG. 1b, a first filling layer, comprising undoped, amorphous silicon with an extremely smooth surface, is deposited into the trench and relief structure. A V-profile (FIG. 1c) is then formed in this Si layer by means of a preferably plasma chemical etching step. During this etching step, the etching rate is set such that it decreases significantly into the depth of the trench compared with the etching rate at the surface and falls to zero at the depth 400 . . . 1000 nm (ARDE: aspect ratio dependent etch/RIE lag). Afterwards, the 'V' etched Si layer is highly doped by means of gas phase doping, preferably by means of arsine.

This V-profile is then filled by a second filling layer 3 (FIGS. 1d, 1e) by the deposition of undoped amorphous silicon with an extremely smooth surface, the electrical conductivity of which is realized in that, during the thermal steps of the subsequent integration process As outdiffuses sufficiently from the first filling layer 2 into the second filling layer 3.

The extremely smooth surfaces of the two amorphously deposited silicon filling layers 2, 3 serve to configure the closing joint in the filling of the trench structure in an ideally smooth and totally void free manner.

In a variant of this exemplary embodiment, the first filling layer 2 comprises amorphous silicon deposited in an undoped manner with an extremely smooth surface, which is highly doped with As later by means of gas phase diffusion. The second filling layer 3 is a metallic layer, preferably made of a material having a high melting point with an extremely smooth surface.

The extremely smooth surfaces of the two filling layers serve for configuring the closing joint in the filling of the trench structure in an ideally smooth and totally void free manner.

The combination of the trench filling comprising polysilicon (first layer 2) directly at the dielectric layer with a metallic core (second layer 3) in the center of the trench structure is particularly advantageous with regard to conductivity, stability/integrity and minimal leakage currents for the trench storage capacitance.

Exemplary Embodiment 2

The individual steps of the trench filling can be seen from FIGS. 2a . . . 2i. The starting point is once again an already prepared trench and relief structure, as illustrated in FIG. 2a.

The fabrication of the V-profile in the first filling layer 2 is effected by firstly depositing a filling auxiliary layer 4, preferably doped $SiO_2$, over the first filling layer 2 (FIG. 2c), the filling auxiliary layer subsequently being removed again in a planarizing manner on the substrate surface (FIG. 2d).

This is followed by a predominantly isotropically acting, preferably wet chemical, etching step (bias etching), the removal rate of which is 5 to 20 times greater for the material of the filling auxiliary layer than for the material of the first filling layer 2 (FIG. 2e).

In this way, until the time of the complete removal of the first filling layer 2 on the substrate surface, in the trench a V-profile is formed in the first filling layer 2 right into the depth, and, apart from the etching time for completely removing the first filling layer 2 from the substrate surface, depends only on the etching rate of the material of the filling auxiliary layer 4.

After this process stage has been reached, the bias etching is stopped and a further, predominantly isotropic, preferably wet chemical, etching is employed, by which the material of the filling auxiliary layer 4 that has remained in the trench is completely dissolved out of the trench again with high selectivity with respect to the first filling layer 2 (FIG. 2f).

In a variant of this exemplary embodiment, the bias etching is replaced by a multi-step etching in which the first filling layer 2 and the filling auxiliary layer 4 are etched away in alternation, with a specific etching solution in each case, in a highly selective manner with respect to the other respective layer, by a certain (small) thickness amount per etching step. This multi-step etching is carried out through to the complete removal of the first filling layer 2 on the substrate surface.

This procedure has a series of advantages over the single step bias etching. Thus, the two etching solutions can be prepared without compromise for a highly selective etching of only in each case the material of the first filling layer 2 or of the filling auxiliary layer 4. During the bias etching, by contrast, the composition and temperature of the etching solution must be set very precisely to a predetermined etching rate ratio of first filling layer 2 and filling auxiliary layer 4.

A further advantage is that the respective removal of thickness of first filling layer 2 and filling auxiliary layer 4 during an etching step can be set and subsequently corrected very precisely by means of the etching time. During the bias etching, by contrast, this must be realized by means of the composition and temperature of the etching solution.

Finally, the implementation of cyclic etching step sequences with different etching solutions, in accordance with the prior art, can be performed very effectively by programmed automatic etching installations with high precision.

The subsequently required etching step for removing the residual material of the filling auxiliary layer 4 that has remained in the trench with high selectivity with respect to the first filling layer 2 is identical, in respect of the etching solution, to the etching solution used during the multi-step etching of the filling auxiliary layer 4 and can be integrated in a simple manner in the programmed sequence of the multi-step etching process.

Afterwards, as in the first exemplary embodiment, this V-profile is filled by a second filling layer 3 (FIGS. 2h, 2i) by the deposition of undoped amorphous silicon with an extremely smooth surface.

With regard to the filling layers, the same specific embodiments as in the first exemplary embodiment can advantageously be employed.

Exemplary Embodiment 3

The occurrence of voids in STI fillings (shallow trench isolation) is prevented in this exemplary embodiment. This exemplary embodiment is described without reference to a drawing figure.

The fabrication of the desired V-profile in the first filling layer (preferably $SiO_2$) is effected by means of an etching step whose rate of removal in the depth of the isolation trenches decreases significantly compared with the rate of removal at the surface of the STI profile, so that the profile is expanded to a greater extent at the surface than at its depth.

This creates a favorable relief form, which allows a completely void free filling with the second filling layer (preferably $SiO_2$). This is followed by the planarization of the STI isolation and the further processing in a conventional manner.

Exemplary Embodiment 4

The two stage filling of the isolation gap interspaces between adjacent gate/word line or metallization tracks with a V etching step after the first filling layer deposition is described here without reference to a drawing.

The fabrication of the desired V-profile in the first filling layer (preferably $SiO_2$) is effected by means of a first etching step, whose etching rate in the depth of the isolation gaps between adjacent tracks decreases significantly compared with the rate of removal at the surface of the gap profile (gap isolation). As a result, the profile is expanded to a greater extent at the surface than at its depth, thereby creating a favorable relief form. This relief form allows a completely void free filling with a second filling layer (preferably $SiO_2$). This is followed by the planarization of the gap fill isolation and the further processing in a conventional manner.

In a variant of the method, the first filling layer is realized by undoped $SiO_2$ and the second filling layer is formed as doped $SiO_2$. By utilizing the dependence of the etching rate of the contact window process on the doping of the gap fill isolator, it is possible for the profile of the contact windows in the subsequent contact window plane to be configured favorably in a self aligning manner at least in the direction of the most closely adjacent tracks. This reduces the frequency of short circuits between the contact plugs of the contact window plane and the tracks.

Exemplary Embodiment 5

A two stage contact plug filling with a V etching step after the first filling layer deposition is described below without reference to a drawing, by means of which the occurrence of voids in the conductive filling of contact windows is avoided.

The fabrication of the V-profile in the first filling layer (here preferably polysilicon) is effected here by means of an etching step whose rate of removal in the depth of the contact windows decreases significantly compared with the rate of removal at the surface of the contact window profile. As a result, the contact window profile is expanded to a greater extent in the surface region than at its depth. This creates a more favorable relief form, which allows a void free filling with the second filling layer (here preferably metal).

In a variant of this exemplary embodiment, the first filling layer is also metallic and preferably comprises a layer stack comprising a thin barrier layer and a metallic filling layer.

For the case where the contact plugs are formed as a layer system separate from the subsequent metallization layer, the planarization of the contact filling is then effected and the further processing, i.e., deposition and patterning of the metallization layer, is then effected, in a conventional manner.

For the case where the contact plugs are formed as part of the metallization layer in the same layer system as the latter, the deposition of the first filling layer is followed by the V etching, then the deposition of the second filling layer and then the patterning of the metallization layer in a conventional manner.

What is claimed is:

1. A method for filling a trench formed in a semiconductor body, the method comprising:
    performing a first deposition process to coat the trench with a first filling layer with high conformity and minimal roughness;
    depositing a filling auxiliary layer over the first filling layer;
    performing a V etch that reaches down to a predetermined depth of the trench in order to produce a V-profile, wherein, in order to form the V-profile, a predominantly isotropically acting wet chemical etching step is carried out until the complete removal of the first filling layer on the surface of the semiconductor substrate and wherein a wet chemical etching is subsequently carried out, by which the material of the filling auxiliary layer that has remained in the trench is completely removed again with high selectivity with respect to the first filling layer; and
    depositing a second filling layer until the trench is completely filled.

2. The method according to claim 1, wherein the filling auxiliary layer comprises doped $SiO_2$.

3. The method according to claim 1, wherein the first filling layer is deposited with a thickness corresponding to about 10 to 30% of a width of the trench.

4. The method according to claim 1, wherein the second filling layer is deposited with a thickness corresponding to an order of magnitude of 50 to 100% of the width of the trench.

5. The method according to claim 1, wherein the V etching is effected by plasma chemical etching.

6. The method according to claim 5, wherein the etching rate of the V etching step is set such that it significantly decreases into the depth of the trench compared with the etching rate at the surface of the semiconductor substrate.

7. The method according to claim 1, wherein the first filling layer comprises an amorphously deposited polysilicon.

8. The method according to claim 7, wherein the first filling layer is doped after the V etching by gas phase diffusion.

9. The method according to claim 1, wherein the first filling layer comprises $SiO_2$.

10. The method according to claim 1, wherein the first filling layer comprises metal.

11. The method according to claim 10, wherein the metal layer is formed as a double layer, comprising a contact barrier layer and a metallic filling layer.

12. The method according to claim 1, wherein the second filling layer comprises an amorphously deposited, highly doped polysilicon.

13. The method according to claim 12, wherein the polysilicon is doped with As.

14. The method according to claim 1, wherein the second filling layer comprises $SiO_2$.

15. The method according to claim 1, wherein the second filling layer comprises metal.

16. A method of manufacturing a semiconductor device, the method comprising:
    forming a trench having sidewalks in a semiconductor body;
    lining the trench with a conformal layer of undoped silicon in contact with said trench sidewalls:
    etching portions of the conformal layer of undoped silicon by performing a preferential etch that etches at a faster rate near a top of the trench so as to form a V-profile;
    doping remaining portions of the conformal layer of undoped silicon; and
    filling the trench with silicon, said silicon filling said trench in contact with said doped remaining portions of the conformal layer of undoped silicon.

17. The method of claim 16 wherein filling the trench with silicon comprises depositing undoped silicon into the trench, the method further comprising doping the undoped silicon by diffusion of dopants from the conformal layer.

18. A method of forming a semiconductor device, the method comprising:
    forming a trench in a semiconductor body;
    conformally lining sidewalls of the trench with a layer of silicon;
    filling the trench with another material; and
    performing an etching step that is preferential to the another material relative to the silicon, the etching step removing the another material from at least a top portion of the trench and creating a V-profile of the silicon layer along the sidewalls of the trench.

19. The method of claim 18 wherein the another material comprises silicon oxide.

20. The method of claim 19 and further comprising, after performing the etching step, depositing silicon to fill the trench.

21. A method of manufacturing a semiconductor device, the method comprising:
    forming a trench in a semiconductor body;
    lining the trench with a conformal layer of undoped silicon;
    etching portions of the conformal layer of undoped silicon by performing a preferential etch tat etches at a faster rate near atop of the trench so as to form a V-profile;
    doping remaining portions of the conformal layer of undoped silicon; and
    filling the trench with silicon, wherein filling the trench with silicon comprises depositing undoped silicon into the trench, the method further comprising doping the undoped silicon by diffusion of dopants from the conformal layer.

* * * * *

UNITED STATES PATENT AND TRADEMARK OFFICE
CERTIFICATE OF CORRECTION

PATENT NO.         : 7,265,025 B2
APPLICATION NO. : 11/010186
DATED                 : September 4, 2007
INVENTOR(S)       : Temmler et al.

It is certified that error appears in the above-identified patent and that said Letters Patent is hereby corrected as shown below:

In Col. 1, line 21, delete "$\leqq 100$ nm," and insert --$\leq 100$nm,--.

In Col. 8, line 5, delete "sidewalks" and insert --sidewalls--.

In Col. 8, line 45, delete "tat" and insert --that--.

In Col. 8, line 46, delete "atop" and insert --a top--.

Signed and Sealed this

Twenty-seventh Day of November, 2007

JON W. DUDAS
*Director of the United States Patent and Trademark Office*